US005489879A

United States Patent [19]

English

[11] Patent Number: 5,489,879

[45] Date of Patent: Feb. 6, 1996

[54] AMPLITUDE AND PHASE ERROR NORMALIZATION OF SUBCARRIER GENERATOR

[75] Inventor: James D. English, Aloha, Oreg.

[73] Assignee: Seiko Communication Systems, Inc., Beaverton, Oreg.

[21] Appl. No.: 389,762

[22] Filed: Feb. 16, 1995

[51] Int. Cl.[6] .............................. H03C 3/00; H04L 27/00

[52] U.S. Cl. ............................ 332/103; 375/296; 379/56; 455/57.1; 455/63

[58] Field of Search .................................... 332/103–105; 375/279, 284, 285, 286, 308; 379/56; 455/53.1, 57.1, 63, 67.3

[56] References Cited

U.S. PATENT DOCUMENTS 5,164,678 11/1992 Puri et al. ............................. 455/63 X

*Primary Examiner*—David Mis
*Attorney, Agent, or Firm*—Elmer Galbi

[57] ABSTRACT

A subcarrier signal generator includes a finite impulse response (FIR) filter responsive to selected FIR coefficients. A first set of FIR coefficients represents an ideal subcarrier shape and center frequency. A calibration step monitors the resulting subcarrier signal and produces a new set of FIR coefficients corresponding generally to the ideal subcarrier signal shape and center frequency, but predistorted according to the compliment of error detected in the actual subcarrier signal. By then loading the new set of FIR coefficients and operating the subcarrier generator, frequency-dependent distortions in the output stage of the subcarrier generator cancel predistortion reflected in the new FIR coefficients. As a result, a high quality subcarrier signal results without use of expensive output stage devices in the subcarrier signal generator.

8 Claims, 6 Drawing Sheets

AMPLITUDE AND PHASE ERROR NORMALIZATION OF SUBCARRIER GENERATOR

BACKGROUND OF THE INVENTION

The present invention relates generally to radio signal broadcast apparatus, and particularly to subcarrier signal generator apparatus.

Some FM radio signal broadcasts include a subcarrier signal. The subcarrier signal delivers, for example, paging data in implementation of a paging system transmitting paging messages to a population of paging devices each monitoring the subcarrier signal. The paging system thereby uses the existing FM signal broadcast facility. The FM broadcast facility receives digital paging messages from a paging system through, for example, a high speed modem coupling the FM broadcast facility and a paging system clearing house. The FM broadcast facility includes a subcarrier generator. The subcarrier generator receives the digital paging message information and incorporates this paging message information into its output, a subcarrier signal. The subcarrier generator applies this output to an exciter, and subsequent FM signal broadcasting devices to provide paging messages in the subcarrier portion of the transmitted FM radio signal.

The quality of a subcarrier signal degrades in the analog circuitry of the typical subcarrier generator device. Frequency-dependent attributes of analog devices, e.g., amplifiers and lowpass filters at the output stage of the subcarrier generator device, convolve a frequency-dependent non-linear phase shift with the generated signal. This adds distortion to the subcarrier signal and degrades overall quality of the information provided by subcarrier signal.

A typical subcarrier generator receives a digital data stream at a symbol generator and applies a resulting waveform symbol sequence to a bandpass finite impulse response (FIR) filter. The FIR filter properly shapes the waveform symbol sequence to achieve ultimately a desired shape and reference frequency, i.e., center frequency, in the transmitted subcarrier signal. A set of the FIR filter coefficients define the resulting shape and therefore the center frequency of the subcarrier signal. Thus, in a typical subcarrier signal generator the FIR coefficients are established at the time of design according to a desired subcarrier signal shape and center frequency. In other words, an ideal shape and center frequency are selected and FIR coefficients calculated to obtain such shape and center frequency.

The FIR filter provides its output to a sequence of output stage devices, e.g., digital-to-analog converter, amplifier, lowpass filter, and final output stage amplifier. Unfortunately, the output stage devices introduce frequency-dependent amplitude and phase distortion in the subcarrier signal relative to the ideal subcarrier signal shape and center frequency. While such subcarrier generator devices reliably produce a useable subcarrier signal, there remains need and opportunity for improvement in the subcarrier signal generated. An analog filter, with good group delay correction, can compensate for the non-linear phase shift introduced, but such a filter is expensive and difficult to design and build and is physically large due to the delay correction section.

It would be desirable, therefore, to provide a subcarrier signal generator at relatively lesser expense, yet compensate for frequency-dependent characteristics and provide a high quality subcarrier signal.

SUMMARY OF THE INVENTION

A subcarrier generator under a preferred form of the present invention includes a bandpass finite impulse response (FIR) filter determined by a set of FIR coefficients. Under the present invention, a first set of FIR coefficients corresponds to an ideal subcarrier signal shape and center frequency. The subcarrier generator operates initially with this first set of FIR coefficients to produce a subcarrier signal. A calibration device monitors the subcarrier signal and calculates a second set of FIR coefficients to deconvolve the output of the analog filter and other frequency-dependent amplitude and phase distortion devices. This corrects for distortion introduced in the output stage of the subcarrier signal generator by predistorting the output of the bandpass FIR filter as a function of the frequency-dependent characteristics of the analog output stage of the subcarrier generator. As a result, the subcarrier signal produced more closely matches the desired shape and center frequency. Calibration under the present invention may be conducted at least once at the time of subcarrier generator device manufacture or installation, and subsequently, on an intermittent or demand basis, to the extent that frequency-dependent characteristics of the subcarrier generator output stage devices change.

The subject matter of the present invention is particularly pointed out and distinctly claimed in the concluding portion of this specification. However, both the organization and method of operation of the invention, together with further advantages and objects thereof, may best be understood by reference to the following description taken with the accompanying drawings wherein like reference characters refer to like elements.

BRIEF DESCRIPTION OF THE DRAWINGS

For a better understanding of the invention, and to show how the same may be carried into effect, reference will now be made, by way of example, to the accompanying drawings in which.

DETAILED DESCRIPTION OF THE PREFERRED EMBODIMENT

Figure 1:
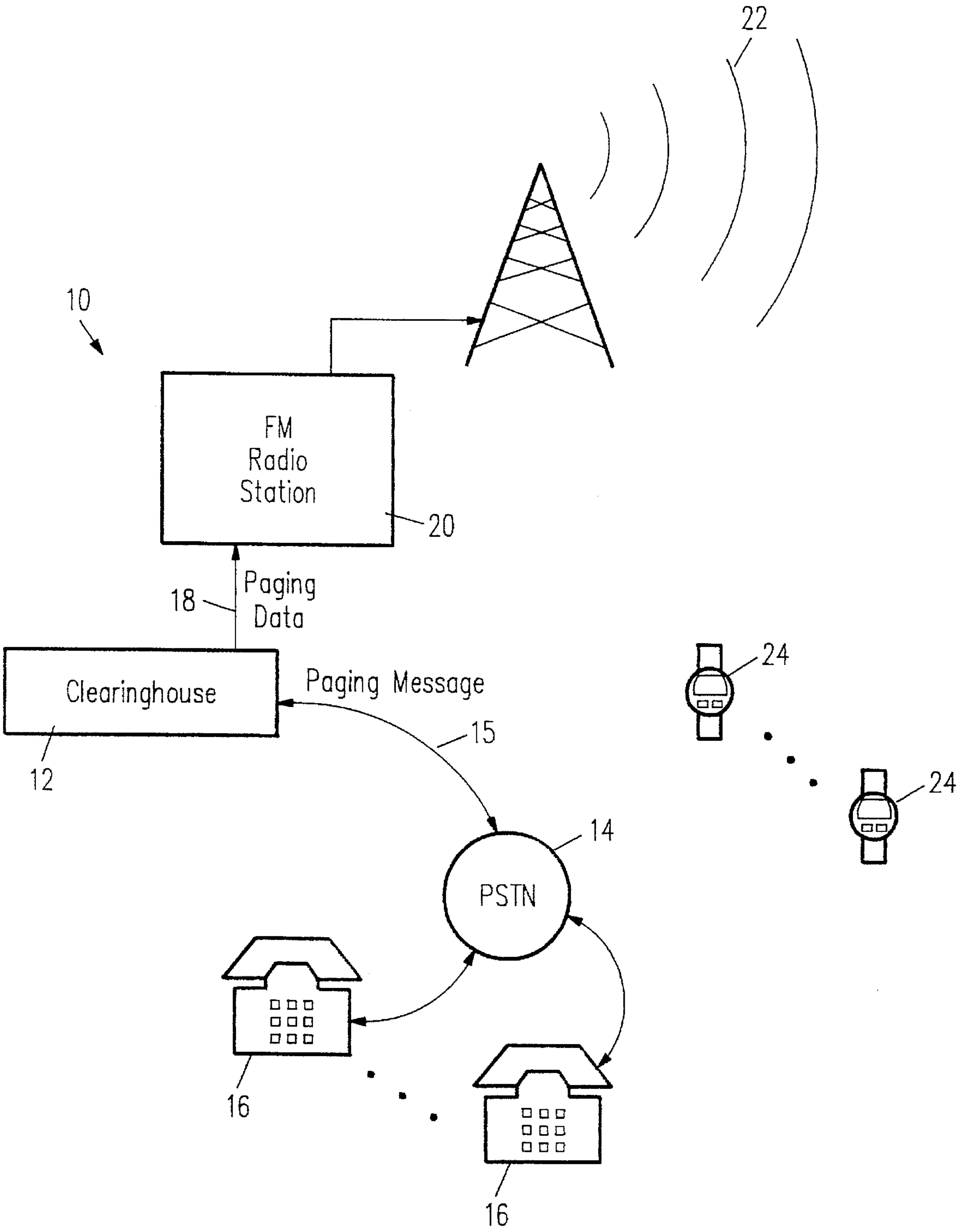
FIG. 1 illustrates a paging system employing a subcarrier generator manufactured, calibrated and operated in accordance with the present invention.

FIG. 1 illustrates a paging system 10 employing a subcarrier generator manufactured and calibrated in accordance with the present invention. While illustrated in the context of paging system 10, it will be appreciated that the present invention may be applied generally to subcarrier generators in a variety of applications.

In FIG. 1, paging system 10 includes a clearinghouse 12 collecting from public switch telephone network (PSTN) 14 paging messages 15 as generated by callers using telephones 16. Clearinghouse 12 submits paging data 18 to FM radio station 20. As described more fully hereafter, station 20 applies paging data 18 to a subcarrier generator (FIG. 2) for incorporation into the FM signal broadcast 22. A population of paging devices 24, illustrated in FIG. 1 as wristwatch paging devices 24, monitor the subcarrier portion of FM signal 22 and extract therefrom paging messages for display.

As for the present invention, paging system 10 employs in radio station 20 a subcarrier generator manufactured, calibrated and operated in accordance with the present invention. By improving the subcarrier signal, paging devices 24 better receive paging messages directed thereto. Furthermore, the present invention allows use of relatively less expensive output stage devices, especially lowpass filters, in the subcarrier generator. Despite use of relatively less expensive device, with greater frequency-dependent distortion allowed by design, the present invention reliably produces a high quality subcarrier signal exhibiting little frequency-dependent distortion in the subcarrier signal produced.

Figure 2:
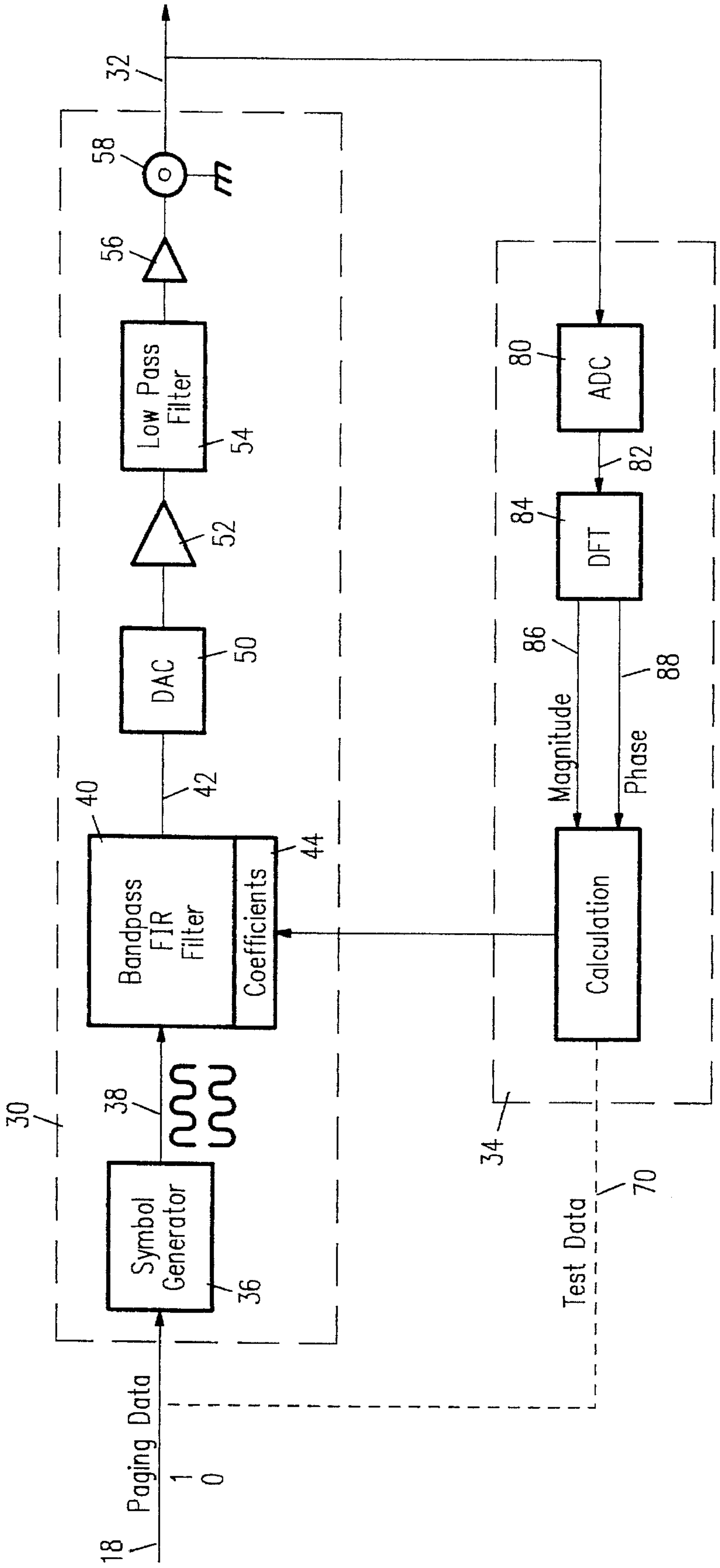
FIG. 2 illustrates a subcarrier generator device used in the paging system of FIG. 1.

FIG. 2 illustrates a subcarrier generator 30 of radio station 20 converting paging data 18 to a subcarrier signal 32. Subcarrier signal 32 appears in FM signal broadcast 22 (FIG. 1). Also in FIG. 2, a calibration device 34 monitors, during a calibration step, subcarrier signal 32 and modifies subsequent operation of subcarrier generator 30 to improve the quality of subcarrier signal 32, i.e., make signal 32 more closely match a desired shape and center frequency.

Subcarrier generator 30 receives paging data 18, a bit stream with a rate of 19 Kilobits per second, at a symbol generator 36. Symbol generator 36 produces a sequence of sine waveform symbols 38, e.g., a one bit in paging data 18 corresponding to a series of positive phase sine waveforms and a zero bit corresponding to a series of negative phase sine waveform symbols, with the sine waveforms operating at 66.5 KHz.

Symbol generator 36 applies the waveform symbol sequence 38 to a digital bandpass finite impulse response (FIR) filter 40. Filter 40 operates in known fashion to produce a preliminary subcarrier signal 42 representing digitally a subcarrier waveform of desired shape and center frequency. More particularly, FIR filter 40 includes a coefficient register 44 holding a set of FIR coefficients calculated to establish a desired shape and center frequency in the subcarrier signal 32. In the particular example illustrated, preliminary subcarrier signal 42 represents digitally a square root cosine bandpass shape centered at 66.5 KHz with the zero at plus or minus 9.5 KHz above and below, respectively, 66.5 KHz. Filter 40, being a digital device, reliably produces representation of the desired shape and center frequency in signal 42 with an intrinsic flat group delay and a phase response substantially linear relative to frequency.

Unfortunately, signal 42 cannot be applied directly as the subcarrier signal 32, and must be applied in series to a digital-to-analog converter 50, an amplifier 52, a lowpass filter 54, and a final output amplifier 66 driving a connector 58 whereat the subcarrier signal 32 is taken in usable form. Digital-to-analog converter 50 samples at four times the center frequency in signal 42, i.e., samples at 266 KHz. Converter 50 introduces a sine X/X roll off in its output, thereby distorting the subcarrier signal as represented in signal 42. Amplifier 52 and lowpass filter 54 also introduce frequency-dependent distortion relative to signal 42. While lowpass filter 54 could be manufactured with flat group delay characteristics over the bandwidth of interest, i.e., over a bandwidth of plus or minus 9.5 KHz relative to the center frequency of 66.5 KHz, such a lowpass filter is expensive. In any event, the output stage of generator 30, i.e., converter 50, amplifier 52, lowpass filter 54, and amplifier 66, are necessarily analog devices and unavoidably introduce to some extent frequency-dependent distortion in the shape and center frequency of subcarrier signal 32 relative to a desired shape and center frequency as represented in preliminary subcarrier signal 42.

The particular distortions introduced in the output stage of subcarrier generator 30 are, generally, unpredictable. The distortion introduced by digital-to-analog converter 50 is, to some extent predictable, but the remaining devices 52, 54, and 56 introduce distortion unique to the individual set of output stage components used. The analog devices each individually produce distinct distortion effects, making difficult compensation for such distortion effects in the design of subcarrier generator 30. Heretofore, such frequency-dependent distortions have been accepted as necessary and unavoidable in use of an analog output stage of the subcarrier generator. Correction with respect to output stage frequency-dependent distortion has taken the form of a more expensive lowpass filter 54.

Under the present invention, however, calibration device 34 accounts for frequency-dependent distortions occurring in a given subcarrier generator 30 during calibration thereof. In particular, calibration device 34 modifies the FIR coefficients register 44 to predistort preliminary subcarrier signal 42. Subsequent distortion introduced in the devices 50, 52, 54, and 56 actually improves the shape and center frequency of the subcarrier signal 32 produced, i.e., improves relative to the signal represented by the predistorted preliminary subcarrier signal 42.

Generally, a first set of FIR coefficients loaded into register 44 represent the ideal shape and center frequency for signal 32, e.g., a square root cosine bandpass shape centered at 66.5 KHz. Calibration device 34 substitutes test data 70 for paging data 18 and monitors the resulting subcarrier signal 32. Magnitude and phase information taken at selected frequency sample points in signal 32 are compared to expected magnitude and phase information at these sample points. Differences between measured magnitude and phase and ideal magnitude and phase define a distortion error. This distortion error provides a basis for modifying the shape and center frequency represented digitally in preliminary subcarrier signal 42, i.e., provides a basis for predistorting signal 42. Once calibration device 34 determines the shape and center frequency to be represented in the predistorted signal 42, it calculates and loads corresponding new FIR coefficients into register 44 of FIR filter 40. In this manner, the subcarrier signal represented by signal 42 is predistorted relative to an ideal shape and center frequency.

Importantly, the predistortion introduced in signal 42 relative to an ideal shape and center frequency is the compliment of distortion introduced by the output stage of generator 30. Thus, predistortion in signal 42 relative to an ideal shape and center frequency negates the distortion introduced in the analog output devices. The resulting subcarrier signal 32 more closely matches the ideal shape and center frequency despite significant frequency-dependent distortion introduced at the output stage of generator 30.

Calibration device 34 receives subcarrier signal 32 at an analog-to-digital converter 80 which passes a digital signal 82 to a discreet fourier transform block 84. Transform block 84 provides a magnitude value 86 and phase value 88 representing subcarrier signal 32 at the time of sampling. Calibration device 34 collects magnitude and phase values to characterize subcarrier signal 32 relative to an ideal shape and center frequency. More particularly, for each frequency sample point in the frequency band of interest, calibration device 34 injects a corresponding tone via test data 70 and collects for each tone injected a magnitude value 86 and phase value 88. By comparing the measured magnitude value 86 and phase value 88 to an expected or ideal magnitude and phase value calibration device 34 quantifies signal 32 deviation relative to an ideal shape and center frequency. As used herein, magnitude and phase values are used to characterize a subcarrier signal. It will be understood, however, that such characteristics may be expressed as a magnitude, phase real number pair or a complex number pair. For the purpose of illustration, FIG. 2 shows collection of a magnitude value 86 and phase value 88 (polar form), but values typically produced by discreet fourier transform are more commonly expressed as complex numbers (rectangular form).

Figure 3:
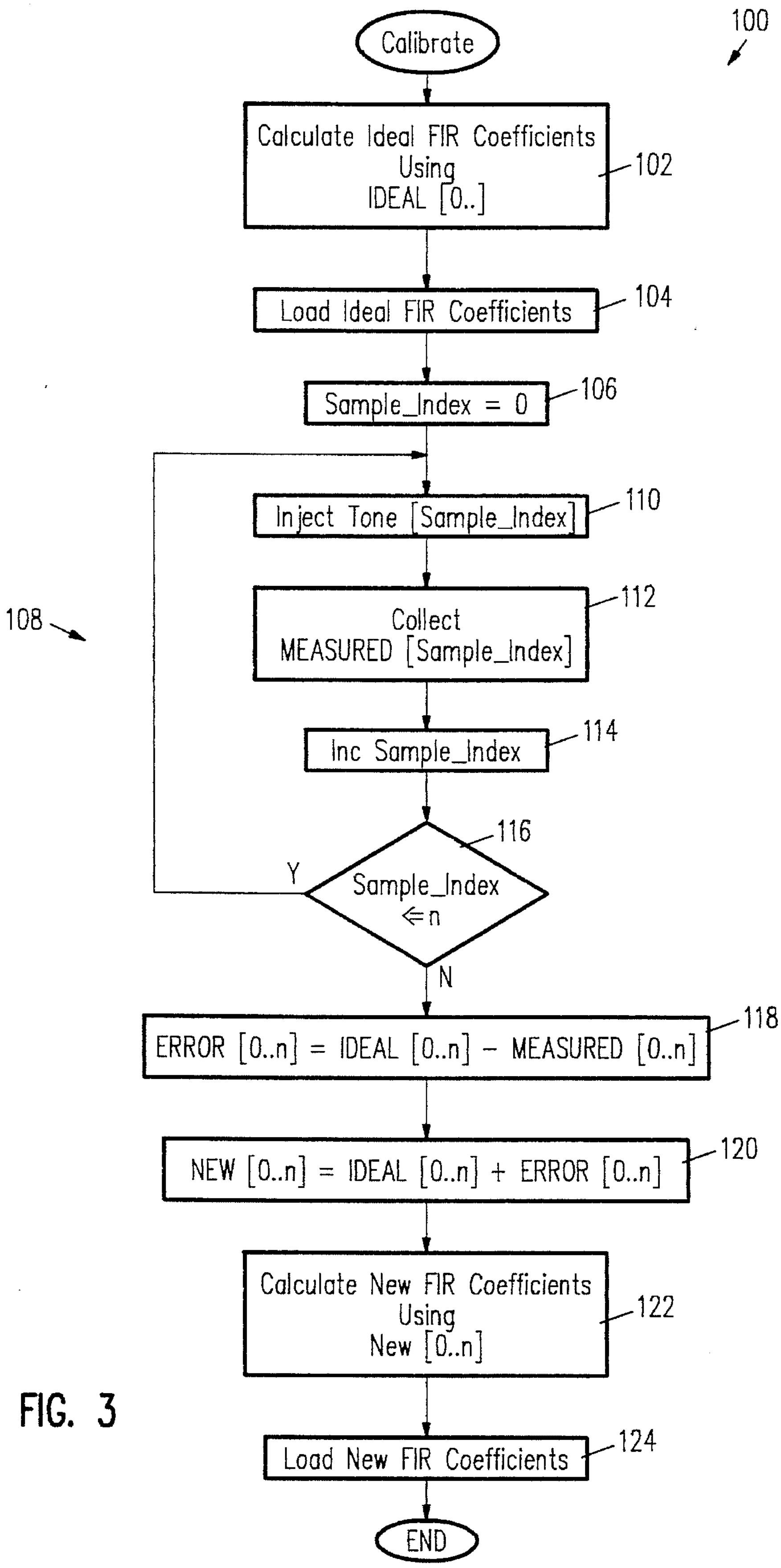
FIG. 3 illustrates by flow chart operation of the subcarrier generator during a calibration procedure.

FIG. 3 illustrates by flow chart a calibrate procedure 100 executed by calibration device 34. As used for the purpose of illustration in FIG. 3, a subcarrier signal waveform shape and center frequency will be shown as a single dimension array holding at each location a complex number pair. The number of locations in the array represent the number of sample points used in representation of the array. In the present discussion, each such data structure references n storage locations and it will be understood that the number of sample points can vary, i.e., the value n can vary, depending on design criteria. Furthermore, it will be understood that each complex number pair, where I represents a real portion and Q an imaginary portion, can be converted to a magnitude M and phase φ according to the following relationship:

$$\phi = ATAN\left(\frac{Q}{I}\right)$$

$$M = \sqrt{I^2 + Q^2}$$

In FIG. 3, block 102 calculates ideal FIR coefficients for bandpass FIR filter 40 (FIG. 2). Block 102 represents either calculation of such ideal FIR coefficients at the time of device 30 calibration, or reference to precalculated ideal FIR coefficients. In either case, representation of a given subcarrier signal shape and center frequency provides basis for calculating FIR coefficients.

The ideal FIR coefficients obtained in block 102 are loaded in block 104 into register 44 of bandpass FIR filter 40. Subcarrier generator 30 produces preliminary subcarrier signal 42 as representing an ideal subcarrier signal of selected shape and center frequency. In block 106, calibration device 34 initializes an index variable, Sample_ Index, to a value zero. Processing then enters a loop 108 wherein calibration device 34 builds a complex number array MEASURED representing the actual subcarrier produced following frequency-dependent distortion in the subcarrier generator 30, i.e., represents the actual subcarrier 32. In block 110, calibration device 34 injects a tone, via test data 70, into symbol generator 36, the tone being selected as a function of the index variable sample point. Following sufficient time to process the injected tone and provide representation in signal 32, calibration device 34 collects in block 112 a magnitude value 86 and phase value 88 for incorporation into the MEASURED complex number array at a location corresponding to the index variable Sample_Index. In block 114, device 34 increments index variable Sample_Index and advances to decision block 116 where Sample_Index is compared to its terminal value n. If additional samples are to be taken, loop 108 repeats wherein device 34 obtains and stores a next sample in the complex number array MEASURED.

Once the array MEASURED is filled with samples, thereby providing representation of the shape and center frequency for subcarrier signal 32 operating under the ideal FIR coefficients, the degree of distortion in signal 32 is computed. In particular, in block 118 array ERROR stores for a sample point representation of the difference between measured and ideal magnitude and the difference between measured and ideal phase. In block 120, a predistorted subcarrier signal waveform and center frequency results by adding arrays IDEAL and ERROR. In particular, for each sample point the error magnitude and error phase are added to the ideal magnitude and phase. The result is represented in the array NEW.

Continuing to block 122, device 34 calculates new FIR coefficients using the array NEW, i.e., using representation of a predistorted subcarrier shape and center frequency. Calibration device 34 then loads, in block 124, the new FIR coefficients into register 44 of FIR filter 40. Subcarrier generator 30 then operates under the new FIR coefficients to produce a preliminary subcarrier signal 42 representing a predistorted subcarrier signal shape and center frequency. Because predistortion in the representation of signal 42 is the compliment of measured distortion introduced in the output stage of subcarrier generator 30, the resulting subcarrier signal 32 closely matches the desired subcarrier shape and center frequency.

Figure 4A:
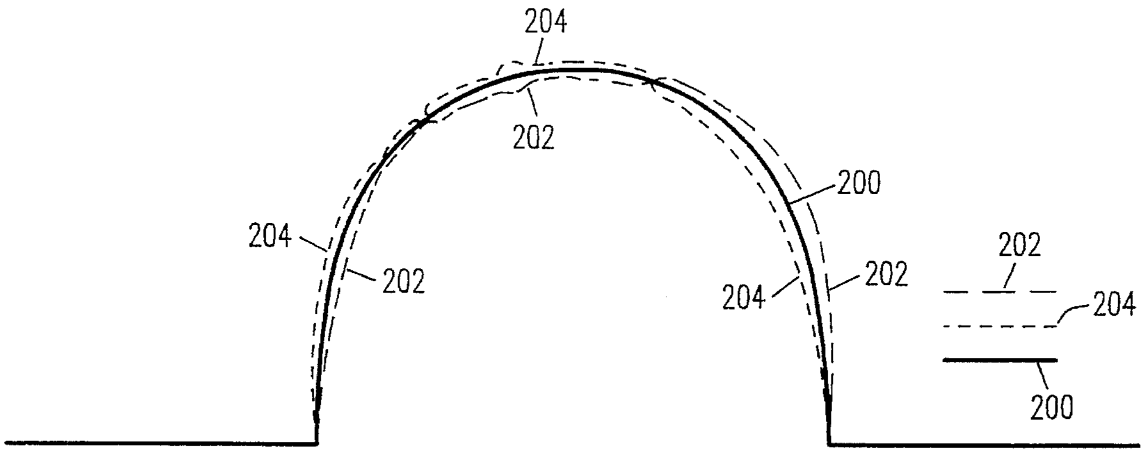
FIGS. 4A and 4B illustrate subcarrier signal characteristics according to ideal, measured, and corrected features under the present invention.
Figure 4B:
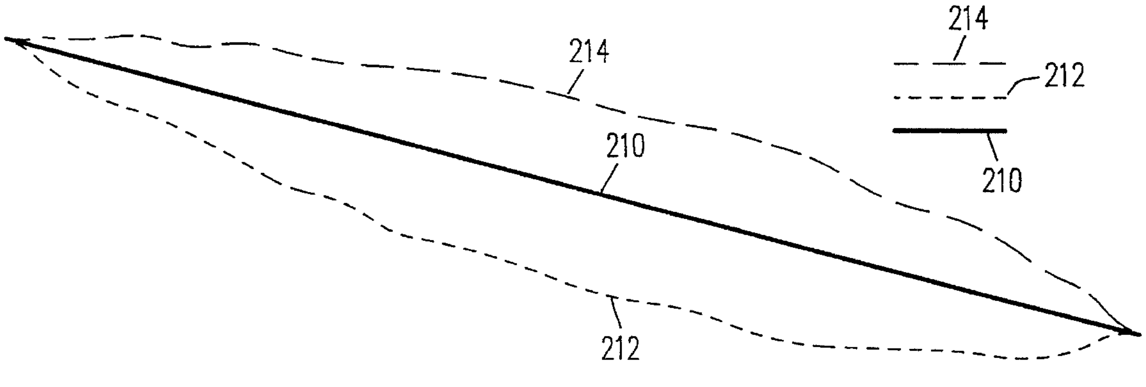

FIGS. 4A and 4B illustrate graphically predistortion of subcarrier signal shape and phase relative to an ideal shape and phase. In FIG. 4A, an ideal subcarrier shape 200 follows the desired square root cosine bandpass shape, i.e., generally a bell-shaped waveform. Measured waveform 202 represents subcarrier signal 32 waveform operating with a set of ideal FIR coefficients in bandpass FIR filter 40. Predistorted waveform 204 represents the ideal waveform 200 plus the compliment of magnitude differences at each sample point between waveform 202 and waveform 200. By calculating a set of FIR coefficients corresponding to predistorted waveform 204, distortion introduced at the output stage of subcarrier generator 30 is cancelled.

FIG. 4B illustrates ideal phase 210 as a diagonal line with measured phase 212 representing phase values 88 taken at each sample point. Predistorted phase 214 represents an error between ideal phase 210 and measured 212, with the error then added to ideal phase 210. By calculating FIR coefficients based on predistorted phase 214, phase distortion introduced at the output stage of subcarrier generator 30 is cancelled.

Figure 5:
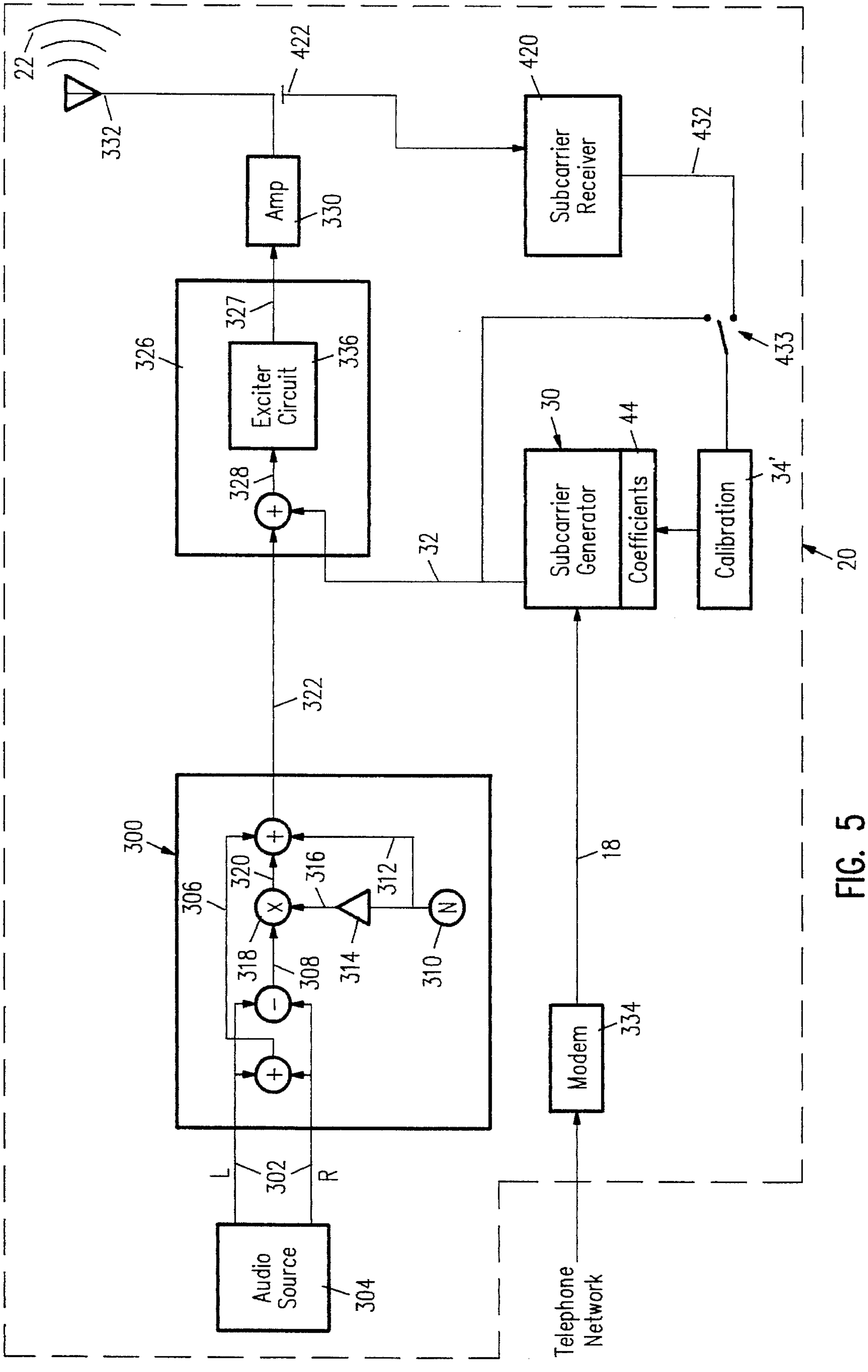
FIG. 5 illustrates by block diagram a radio station of FIG. 1 employing a subcarrier generator and calibration thereof under the present invention.

FIG. 5 illustrates in more detail the radio station 20 including subcarrier generator 30 as described herein, and further an alternative embodiment of the present invention. In FIG. 5, a stereo generator 300 receives left and right channels of a main audio signal 302 from an audio source 304. In stereo generator 300, left and right signals 302 are combined to produce a left-plus-right signal 306, and subtracted to produce a left-minus-right signal 308. A pilot generator 310 makes available a pilot signal 312 at 19 KHz and, via multiplier 314, a 38 KHz signal 316. Signals 308 and 316 join at multiplier 318 to produce signal 320. Signal 320 is then added to signal 306 and to pilot signal 312 to derive stereo multiplexed signal 322. Exciter 326 receives stereo multiplexed signal 322 and subcarrier signal 32 as described herein above. Exciter 326 sums stereo multiplexed signal 322 and subcarrier signal 32 as composite signal 328.

Figure 6:
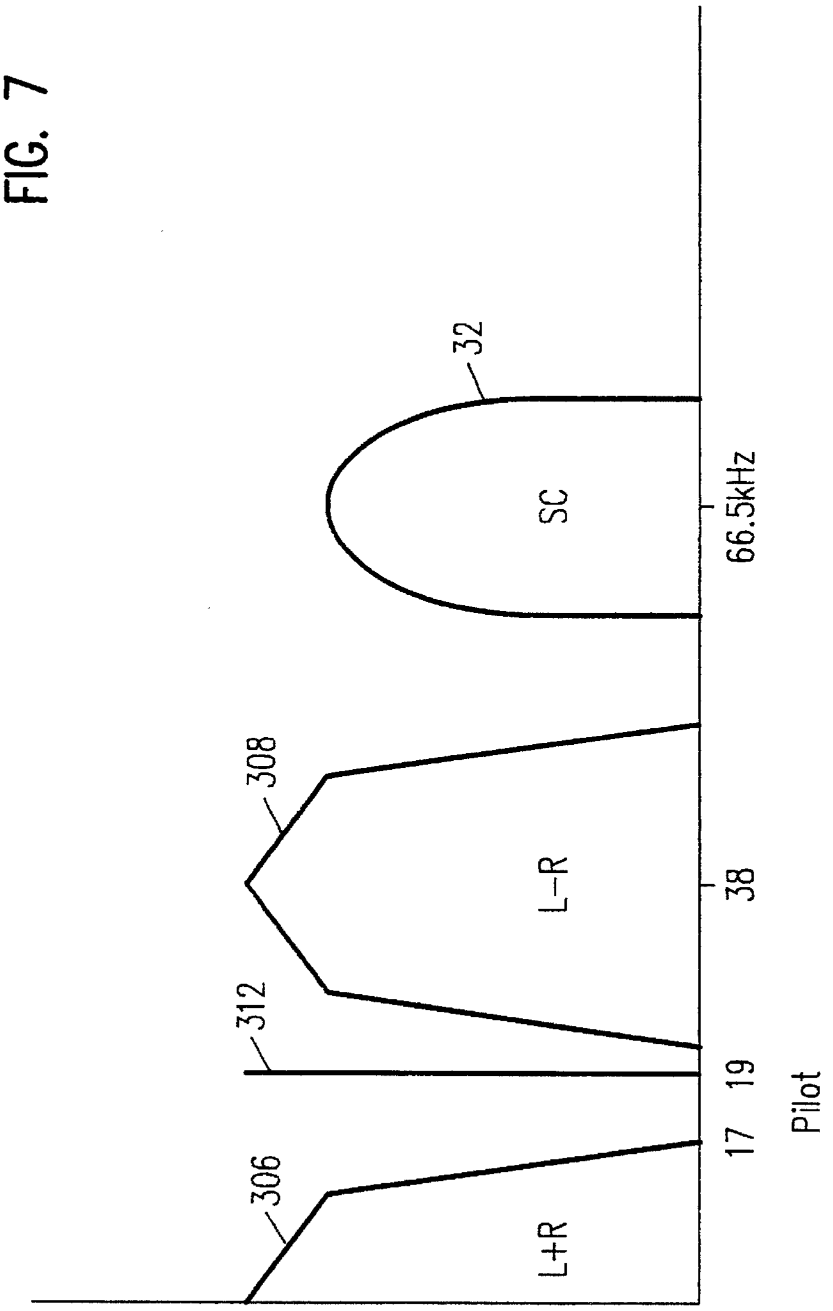
FIG. 6 illustrates a spectrum of baseband composite signal driving an exciter within the radio station of FIGS. 1 and 5.

FIG. 6 illustrates the spectrum of baseband composite for signal 328. Left-plus-right signal 306 and left-minus-right signal 308 appear adjacent to pilot signal 312. Subcarrier signal 32 appears adjacent to left-minus-right signal 308, centered at 66.5 KHz. Signal 328 drives an exciter circuit 336 of exciter 326. Exciter 326 output 327 drives amplifier 330 which in turn drives antenna 332. The composite of signals 306, 312, 308, and 32 thereby appear in transmission 22.

Paging devices 24 extract from transmission 22 paging information within the subcarrier signal 32 and, when addressed thereto, collect a paging message for display and storage.

Figure 7:
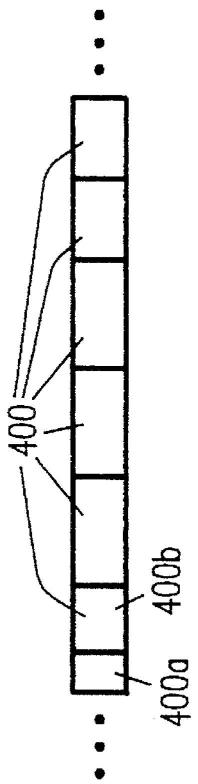
FIG. 7 illustrates a sequence of paging message data packets represented in the subcarrier signal produced.

FIG. 7 illustrates a sequence of paging message data packets provided in bit stream 18. As callers submit paging requests to clearinghouse 12, clearinghouse 12 assembles data packets 400, each including at least an address field 400*a* and a data field 400*b*. Fields 400*a* and 400*b* represent a paging message 15, i.e., identify a selected paging device 24 in field 400*a* and provide a message to be displayed in field 400*b*. Clearinghouse 12 assembles a sequence of data packets 400 and submits data packets by modem to radio station 20 as bit stream 18.

Returning to FIG. 5, subcarrier generator 30 is, under one aspect of the present invention, calibrated as described herein above by monitoring subcarrier signal 32. Under such calibration, frequency-dependent distortion introduced in subcarrier generator 30 is normalized by appropriate calculation of FIR coefficients. An alternative form of the present invention contemplates also normalization of frequency-dependent distortion introduced in exciter circuit 336 and amplifier 330. In particular, a subcarrier receiver 420 collects the antenna 332 feed at a tap or "sniffer" 422, i.e., takes a very small portion of the signal applied to antenna 332. Subcarrier receiver 420 then makes available a subcarrier signal 432. Signal 432 may be of identical format as that of subcarrier signal 32 whereby calibration device 34' need not be modified to monitor selectively one of subcarrier signals 32 or 432 by manipulation of switch 433. In any case, calibration device 34' receives representation of a subcarrier signal to establish normalization as described herein, i.e., calculates new FIR coefficients to pre-distort the output of subcarrier generator 30. In this manner, calibration device 34' monitors selectively subcarrier signal 32 or subcarrier signal 432 in calibration of subcarrier generator 30, i.e., to de-convolve frequency-dependent distortion.

Thus, an improved subcarrier generator method of manufacture and operation has been shown and described. The present invention provides predistortion in representation of a subcarrier signal to compensate for distortion introduced in, for example, the output stage of the subcarrier generator. By measuring individually frequency-dependent distortion in each subcarrier generator unit, individually calculated FIR coefficients are used in the FIR filter to predistort or precompensate for the particular frequency-dependent distortions of that particular subcarrier generator unit or broadcast facility. Expensive and complex filter devices in the output stage of the subcarrier generator need not be used. Instead, frequency-dependent distortion is allowed, and a calibration step measures such distortion and calculates new FIR coefficients in compensation thereof. Thus, a less expensive subcarrier generator results, but without compromising quality in the subcarrier signal produced.

The calibration step described herein may be conducted initially at the time of manufacture, i.e., after sufficient assembly of a given subcarrier generator unit to produce a subcarrier signal 32. A unique set of FIR coefficients for that unit are thereby calculated and loaded at the time of manufacture. Calibration under the present invention may also be executed dynamically, on demand, or during initialization routines. While illustrated herein as a FIR register 44, it will be understood that FIR coefficients may be stored in a number of storage devices, e.g., processor registers, disk drive data structures, and memory locations. Calibration under the present invention only requires that such FIR coefficients be modifiable to establish calculated predistortion.

It will be appreciated that the present invention is not restricted to the particular embodiment that has been described and illustrated, and that variations may be made therein without departing from the scope of the invention as found in the appended claims and equivalents thereof.

What is claimed is:

1. A method of subcarrier generator manufacture and calibration, the subcarrier generator producing a subcarrier signal of selected shape and phase, said method of manufacture comprising the steps:

providing said subcarrier generator including a signal shaping input stage, said signal shaping input stage being responsive to a data signal input and to a parameter set defining at least signal shape, said generator further including an output stage providing said subcarrier signal in response to said input stage, said;

calculating an ideal parameter set corresponding to said signal of selected shape and phase;

applying said ideal parameter set to said subcarrier signal generator;

operating said subcarrier signal generator while concurrently monitoring said subcarrier signal;

calculating an error in said subcarrier signal relative to said selected shape and phase;

calculating a new parameter set corresponding to said selected shape and phase and further corresponding distortion as a function of said error; and applying said new parameter set to said subcarrier generator in subsequent operation thereof.

2. A method according to claim 1 wherein said signal shaping input stage includes a finite impulse response filter and said parameter sets applied thereto are sets of finite impulse response coefficients dictating output of said finite impulse response filter.

3. A method according to claim 1 wherein said output stage includes at least one of a lowpass filter and an amplifier having frequency-dependent characteristics reflected in said calculated error.

4. A method according to claim 1 wherein said calculated error corresponds to frequency-dependent distortion in said subcarrier signal relative to said selected shape and phase.

5. A subcarrier signal generator and related calibration apparatus comprising:

a subcarrier signal generator receiving a data sequence and producing a subcarrier signal of selected shape and phase carrying said data sequence, said subcarrier signal generator referencing a parameter set defining said selected shape and phase; and a calibration device measuring error in said subcarrier signal and calculating a new parameter set corresponding to a distorted subcarrier signal, distortion in said distorted subcarrier signal being relative to said selected shape and phase and a compliment of said measured error.

6. An apparatus according to claim 5 wherein said subcarrier signal is taken as output directly from said subcarrier signal generator.

7. An apparatus according to claim 5 wherein said subcarrier signal is taken from a subcarrier receiver monitoring a transmission including said subcarrier signal.

8. In combination, a subcarrier signal generator converting a data stream to a subcarrier signal having shape and phase corresponding to a parameter set applied thereto;

a calibration device monitoring said subcarrier signal, calculating an error in shape and phase relative to said selected shape and phase, calculating a new parameter set corresponding to said selected shape and phase and to said calculated error.

* * * * *